United States Patent [19]

Mazzali

[11] Patent Number: 5,122,473
[45] Date of Patent: Jun. 16, 1992

[54] PROCESS FOR FORMING A FIELD ISOLATION STRUCTURE AND GATE STRUCTURES IN INTEGRATED MISFET DEVICES

[75] Inventor: Stefano Mazzali, Carnate, Italy

[73] Assignee: SGS-Thomson Microelectronics s.r.l., Italy

[21] Appl. No.: 596,301

[22] Filed: Oct. 12, 1990

[30] Foreign Application Priority Data

Oct. 24, 1989 [IT] Italy ................. 83643 A/89

[51] Int. Cl.$^5$ ......................................... H01L 21/265
[52] U.S. Cl. .......................................... 437/40; 437/67; 437/70; 357/23.11; 357/47
[58] Field of Search ............... 437/67, 68, 69, 40, 437/41, 70; 357/23.11, 47

[56] References Cited

U.S. PATENT DOCUMENTS

| | | |
|---|---|---|
| 4,455,740 | 6/1934 | Iwai ........................... 437/67 |
| 4,506,434 | 3/1985 | Ogawa et al. ............... 437/67 |
| 4,543,706 | 10/1985 | Bencuya et al. ............ 437/67 |
| 4,697,071 | 6/1986 | Kita ............................ 437/67 |
| 4,829,019 | 5/1989 | Mitchell et al. ............. 437/69 |
| 4,876,216 | 10/1989 | Tobias et al. ............... 437/67 |

FOREIGN PATENT DOCUMENTS

| | | | |
|---|---|---|---|
| 0137650 | 10/1981 | Japan .................... | 437/70 |
| 0117753 | 6/1985 | Japan .................... | 437/67 |
| 0100944 | 5/1986 | Japan .................... | 437/69 |

Primary Examiner—Brian E. Hearn
Assistant Examiner—Kevin M. Picardat
Attorney, Agent, or Firm—Pollock Vande Sande and Priddy

[57] ABSTRACT

Through a process perfectly suitable for fabricating integrated MISFET devices with an extremely high packing density, the field isolation structure and the gate structures of MISFET devices are simultaneously formed while attending an excellent planarity of the front of the wafer without the need of particularly burdensome techniques in order to preserve the crystallographic integrity of the substrate which is often negatively affected through conventional nitride process or by the etching of the silicon substrate as in BOX isolation processes. A patterned matrix layer of polycrystalline silicon is used for masking the active areas from the isolation implantation and from a subsequent low pressure chemical vapor deposition of a TEOS layer having a thickness substantially equal to the thickness of the masking matrix layer of polycrystalline silicon to form the field isolation structure. After having planarized the surface and exposed completely the top surfaces of the masking portions of the polycrystalline silicon matrix layer, a second layer of polycrystalline silicon is deposited and thereafter the polycrystalline silicon is doped. Finally the doped polycrystalline silicon is patterned by masking and etching steps for defining the gate structures.

4 Claims, 7 Drawing Sheets

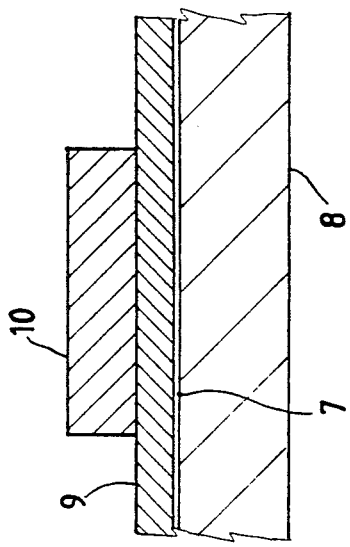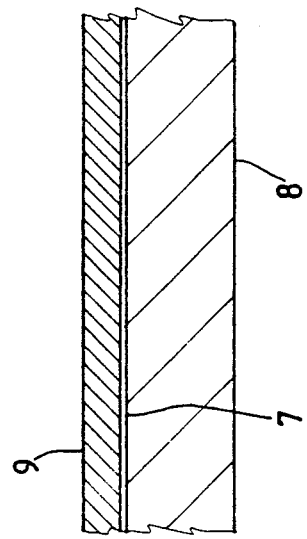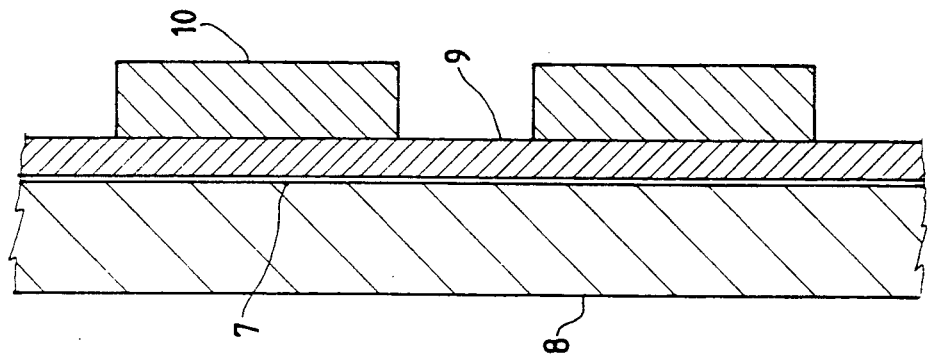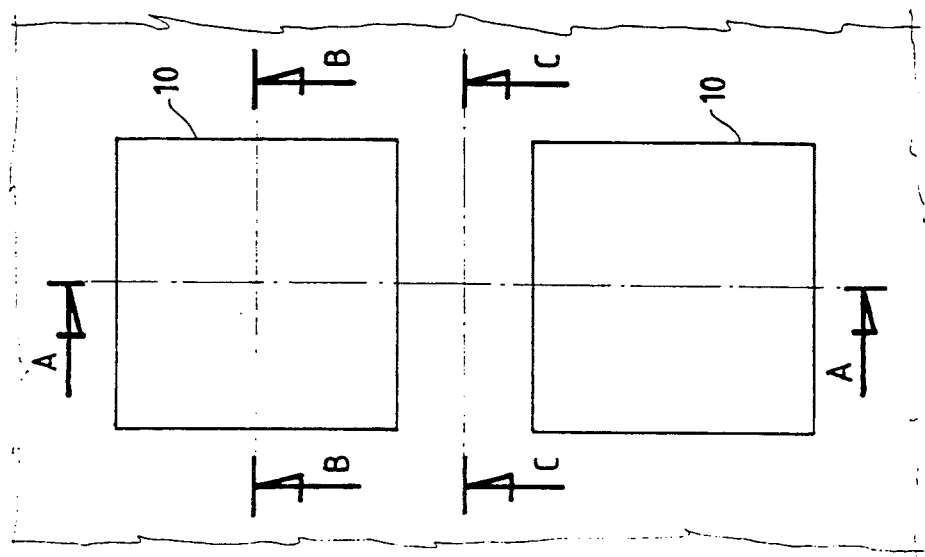

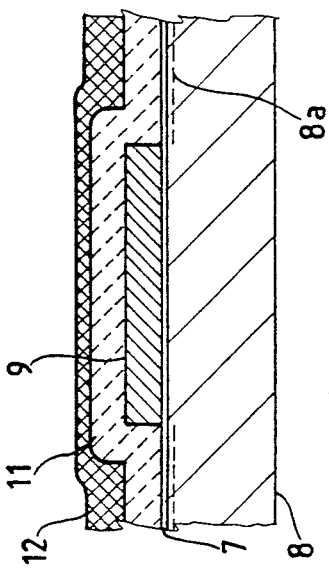
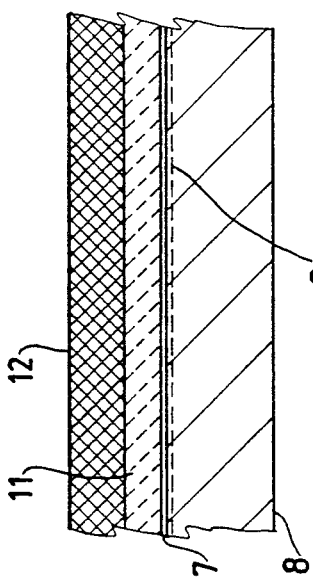
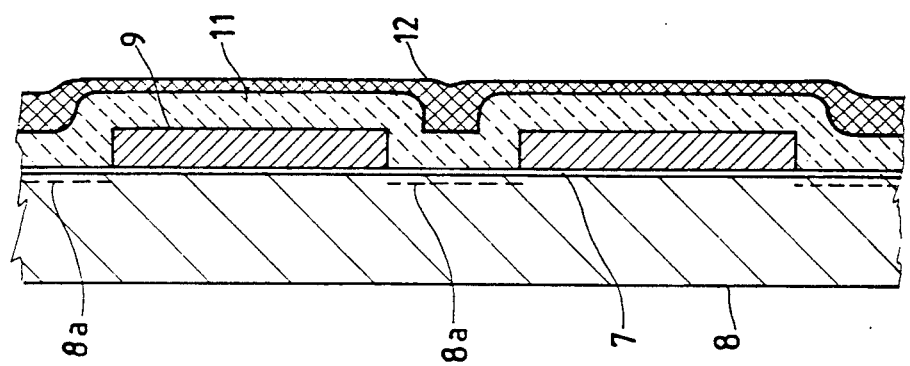
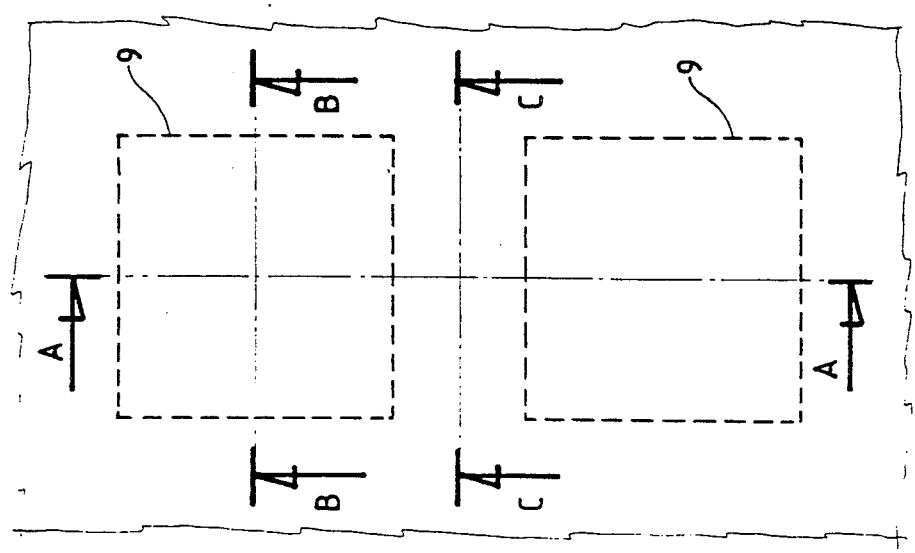

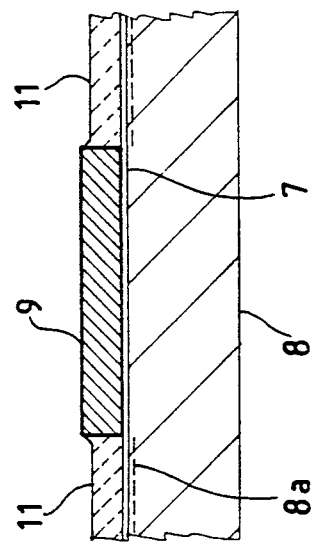
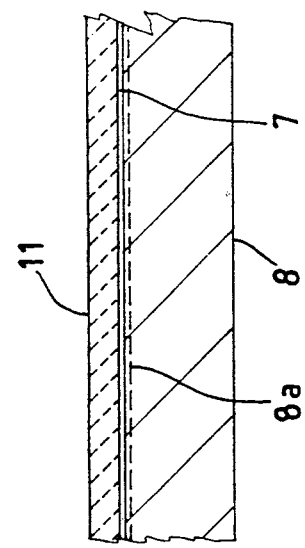
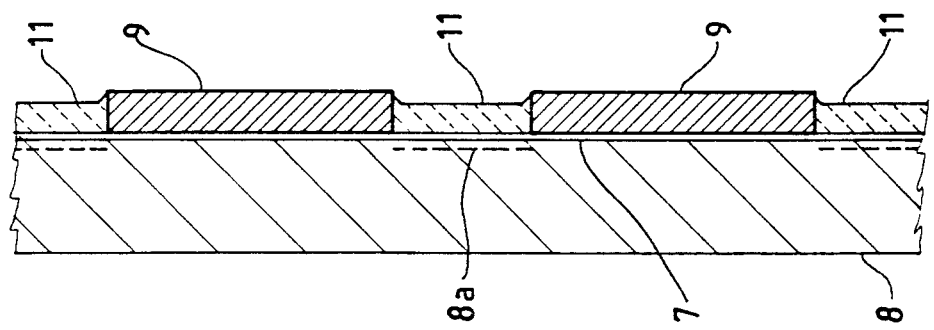
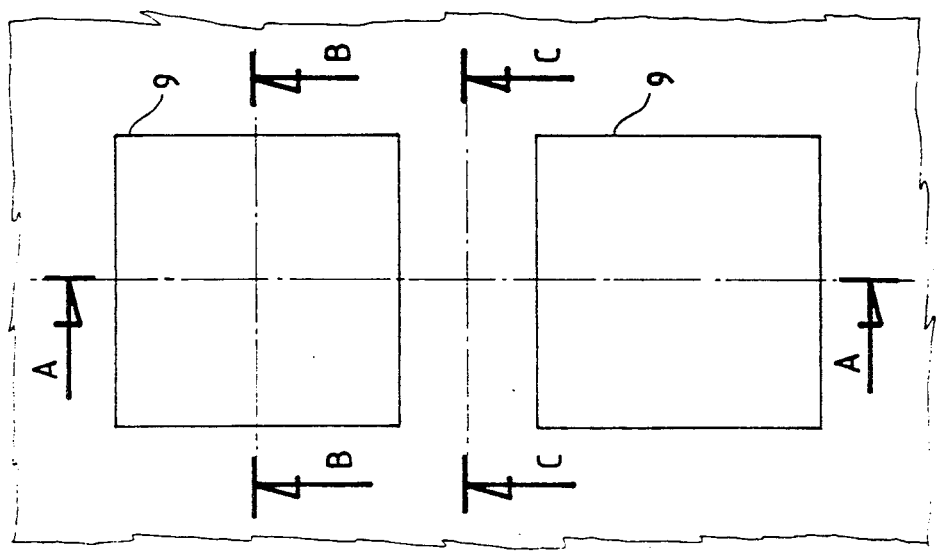

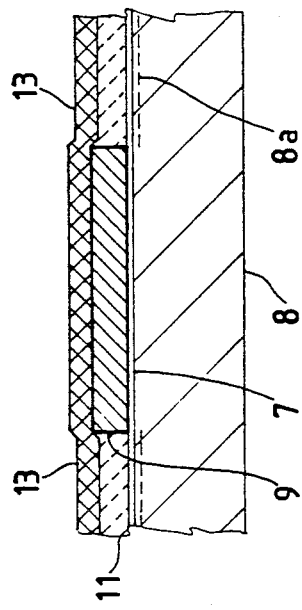
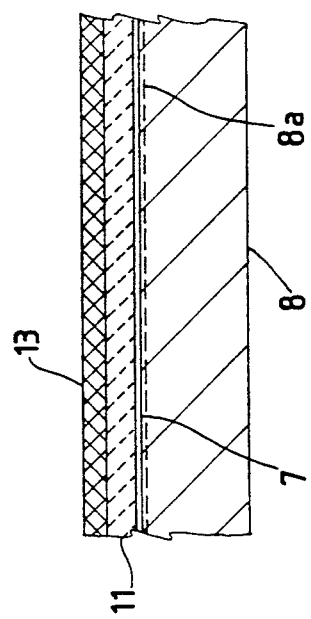
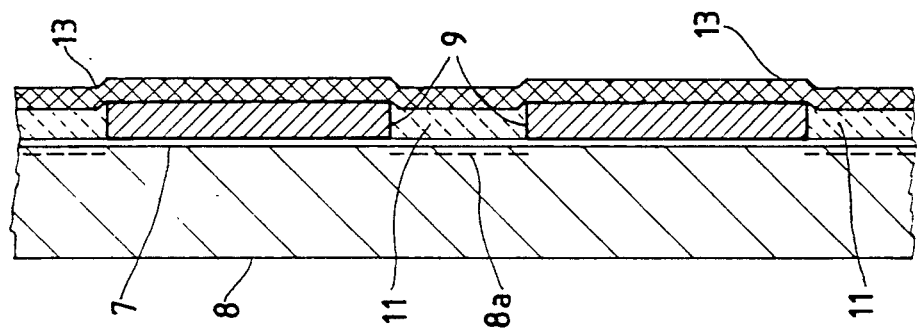
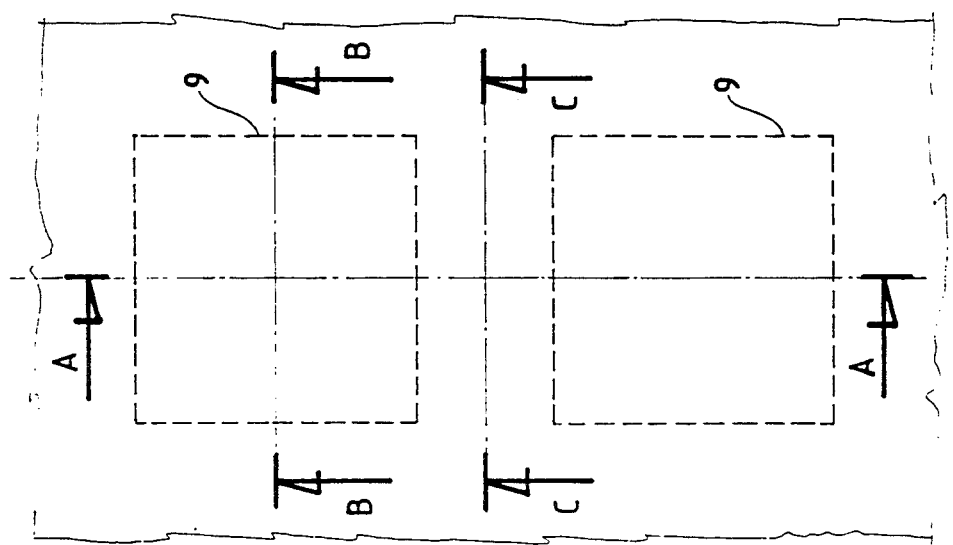

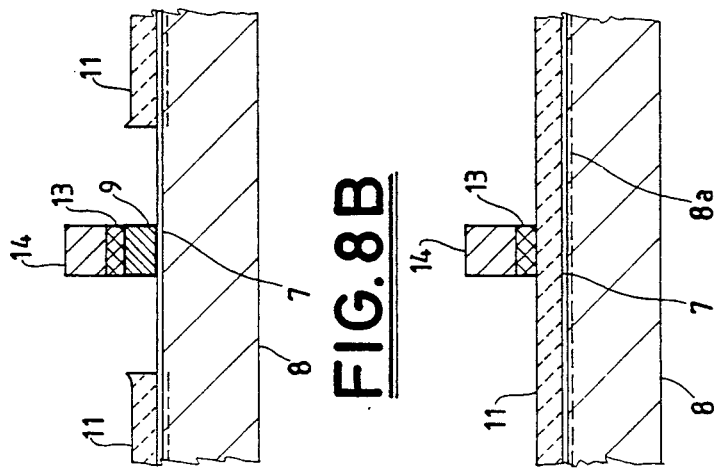
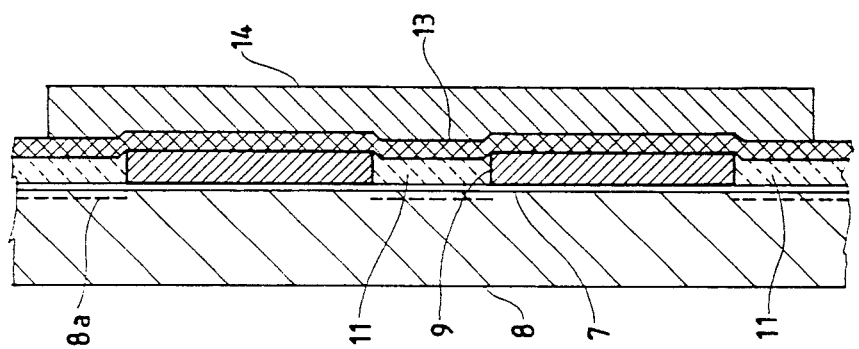
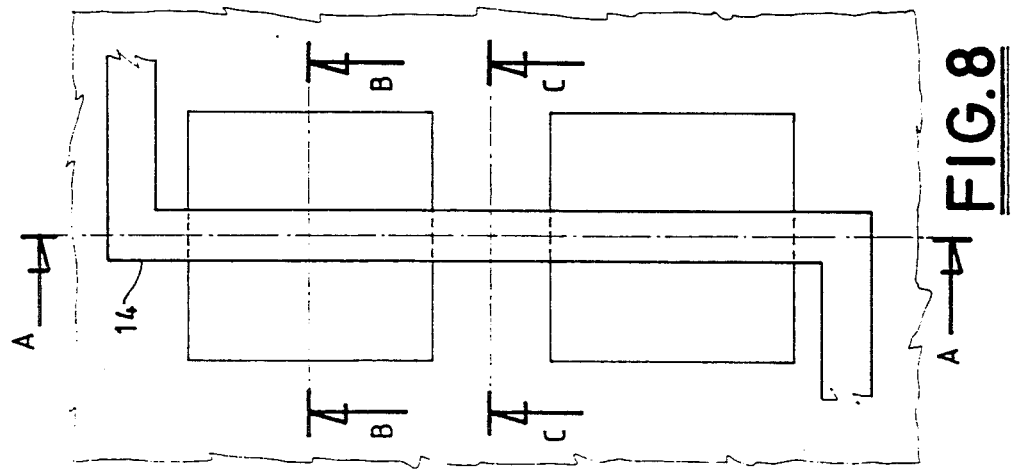

PROCESS FOR FORMING A FIELD ISOLATION STRUCTURE AND GATE STRUCTURES IN INTEGRATED MISFET DEVICES

BACKGROUND OF THE INVENTION

1. Field of the Invention

The present invention relates to a process for forming the field isolation structure and the gate structure of integrated MISFET devices on a monolithic semiconducting substrate. The new process is particularly suited for making devices with a high packing density (VLSI and ULSI), i.e. characterized by submicrometric features.

2. Description of the Prior Art

In MISFET devices or more specifically in integrated MOSFET devices, it is essential to provide an isolation structure among distinct integrated devices (i.e. among the active areas). A primary function of the isolation structure is that of preventing the operation of parasitic MOSFET transistors which are created by connecting together the individual real transistors. This is schematically shown in FIGS. 1 and 2, which represent respectively a schematic plan view and a partial elevation cross section of a pair of integrated MOSFET transistors: A and B, having a common gate structure constituted by the polycrystalline silicon line 1, which crosses the active areas of the two transistors A and B, between the respective source areas 2a and 2b and drain areas 3a and 3b. The two active areas are geometrically defined by the field isolation structure 4, which is constituted by a relatively thick dielectric layer, typically a field oxide layer, thermally grown by oxidation of the silicon substrate. As it is easily observed in FIGS. 1 and 2, in the zone defined by the dash-line perimeter P of FIG. 1, a parasitic MOSFET transistor is present, the gate 1 of which is common to the gate of the two real transistors, as shown in the partial cross sectional view of FIG. 2, viewed on the cross section plane II—II, indicated in FIG. 1.

In order to prevent the operation of this parasitic MOSFET it is necessary to depress as much as possible its electrical characteristics and such a function is provided by the field oxide 4, which actually represents the gate oxide of such a parasitic transistor. Usually a parameter, called threshold voltage (Vt) is defined to represent the minimum voltage which must be applied to the gate of a transistor (parasitic) for allowing a current through the transistor's channel. This critical voltage is as higher as thicker is the isolation field oxide and as higher is the doping level of the semiconducting substrate in the region underneath the isolation field oxide. For this reason, as shown in FIG. 2, the formation of the field isolation structure normally comprises the implantation of a dopant in order to create a region 5 having an increased doping level in the substrate semiconductor directly under the field oxide. Moreover the relatively thick dielectric layer constituted by the field oxide reduces the parasitic capacitance between superimposed conducting layers and the semiconducting substrate.

Conventionally the field oxide is grown by thermal oxidation of a monocrystalline silicon substrate, continued until the desired thickness of oxide is obtained over areas geometrically defined by a masking layer of silicon nitride, a material which is impervious to oxygen diffusion and which thus protects the active areas during such a heavy oxidation heat treatment, which generally requires exposing the silicon to an oxidizing atmosphere under conditions which cause oxygen to react continuously with hydrogen. Typically the field oxide thickness is greater than 5.000 Angstroms (Å), i.e. at least about twenty times thicker than the gate oxide layer which normally is formed in active areas, by thermal oxidation of the silicon under strictly controlled conditions.

The growth of the field oxide for obvious reasons of productivity must be conducted at a relatively high temperature ($T > 800°$ C.). The masking silicon nitride has a thermal expansion coefficient substantially different from that of monocrystalline silicon and this difference of thermal expansion coefficients induces stresses in the silicon substrate which may often generate crystal lattice defects which severely affect the electrical behaviour of the integrated device. Moreover the different thermal expansion between the substrate and the masking silicon nitride layer contributes to the formation of a tapered appendix on the flank of the field oxide (also known as "planox beak"), because the oxide tends to grow, at a progressively lower rate, also under the perimetral portion of the masking nitride layer through a normal diffusion of oxygen in silicon and because the edge of the nitride layer tends to curl by rising slightly as a consequence of the difference of thermal expansion coefficient. These phenomena severely limit the possibility of reducing the dimensions of the integrated structures.

Also the remarkable loss of planarity of the front surface of the device, due to the non-negligeable height of the steps between the active areas and the top surface of the field oxide becomes an extremely limiting factor in terms of reduction of size of the integrated devices because of increasing difficulty of ensuring a good step-coverage by the metal layers to be deposited thereon (i.e. problems of electrical continuity of interconnection metal tracks).

For overcoming these limitations in order to reach higher packing densities, alternative techniques have been proposed for forming the field isolation structure, which require a pre-etching of the silicon in the isolation areas, followed by implantation of the dopant for increasing the doping level in these isolation areas, followed by filling of these etched regions with a dielectric material, e.g. a deposited silicon oxide. These techniques, also known by the acronym BOX-isolation, from "Buried Oxide Isolation", permit to maintain the surface of the front of the wafer substantially flat, but are costly because of the necessary pre-etching of the monocrystalline silicon substrate and moreover the techniques used for etching the substrate may also generate defects in the crystal.

OBJECTIVES AND SUMMARY OF THE INVENTION

The process object of the present invention overcomes all these drawbacks of the known processes, by permitting to form the field isolation structure in a manner characterized by an extremely high precision in the geometrical definition thereof, while maintaining an outstanding planarity of the device through a sequenc of manufacting steps which do not induce any appreciable stress in the monocrystalline semiconducting substrate.

Basically the formation of the field isolation, beside the implantation of a dopant for increasing the doping level of the relative superficial region of the semiconducting substrate, does not imply any modification or cutting of the substrate material itself (oxidation or etching) because the field isolation dielectric layer is at least partially formed by chemical vapor deposition of a suitable dielectric material over defined portions of the substrate's surface.

During the deposition of the dielectric material of the field isolation structure the active areas on the front of the substrate are masked by portions of matrix layer of a first conducting material, purposely deposited and geometrically defined beforehand and from which the gate structures of the integrated MISFET devices will be patterned out, eventually.

Therefore, through the process of the invention, beside forming the field isolation structure, also the gate structures within the respective active areas are substantially prearranged.

The field isolation dielectric layer, chemically deposited from vapor phase in an essentially conformal manner and with a thickness substantially similar to the thickness of the portions of the matrix layer of conducting material masking the active areas, may be planarized by using any one of the commonly known techniques. The planarization may be accomplished by spinning a glassy material (Spun-On-Glass or SOG) or a sufficiently fluid photoresist material capable of filling the cavities on the wafer's surface, or by depositing thereon a material such as a boron-phosphorus silicate glass which may then be plastically-reflown by heat treatment. After having covered the wafer's surface with the planarizing material, the surface is customarily subjected to an etch-back step which is continued until exposing the peaks of the portions of said matrix layer of the first conducting material which still cover the active areas. In this way a substantially flat surface, free of steps, can be easily obtained. Over this planarized surface, a second layer of the same conducting material of said first matrix layer is deposited in electrical continuity with the underlying exposed portions of said first matrix layer which still cover the respective active areas. Through a masking step using a common gate MASK, the gate structures are geometrically defined and the conducting material is etched and removed completely from all the unmasked areas under selective etching conditions for the conducting material.

The fabrication process may then continue in accordance with a standard sequence of operations to conclusion, having so formed the field isolation structure and the gate structures of the integrated MISFET devices by the process of the invention, fully accomplishing the set objectives.

Among the numerous advantages of the process of the invention in respect to the known processes, the following may be cited:

1) total absence of tapered appendices (planox beaks) along the edges of the isolation field oxide and therefore eminent suitability of the process to fabricate devices with a high packing density;
2) substantially flat surface of the wafer;
3) absence of heavy heat treatments;
4) absence of stresses induced in the monocrystalline semiconducting substrate;
5) the use of silicon nitride is no longer required and consequently there is no longer the need for a dedicated deposition oven for this material, moreover the growth of the so-called "pad oxide" layer which is normally associated with the silicon nitride masking technique is no longer required;
6) streamlined flow-chart in comparison with the flow-chart of a traditional "nitride" process or of a "BOX-isolation" process;
7) possibility of increasing the thickness of the field isolation dielectric for particular applications without materially burdening the fabrication process since the dielectric material is deposited and not thermally grown.

BRIEF DESCRIPTION OF THE DRAWINGS

The different aspects and advantages of the invention will become evident through the following description of a preferred embodiment and by reference to the appended drawings, wherein.

Figure 2:
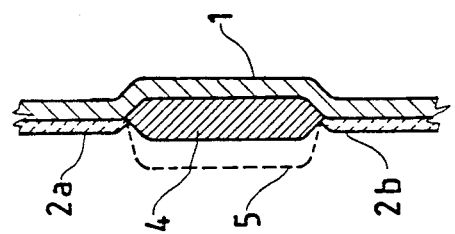
FIG. 2 is a partial cross section of a particular zone of the integrated structure of FIG. 1 viewed on the cross section plane II—II and wherein the field isolation structure is a field oxide thermally grown in accordance with a known technique.
Figure 1:
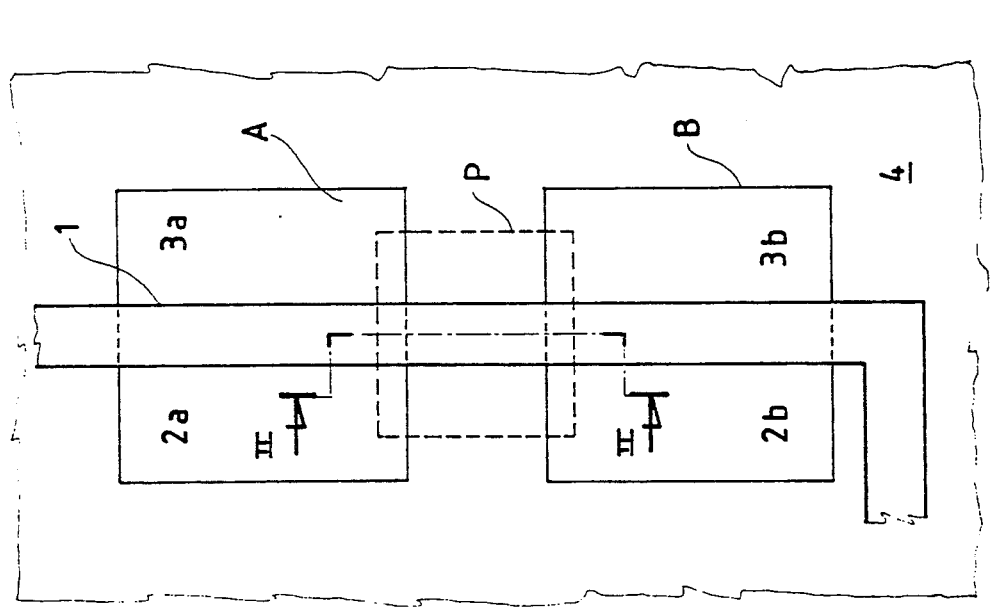
FIG. 1 shows a schematic plan view of a pair of integrated MOSFET transistors.
Figure 4B:
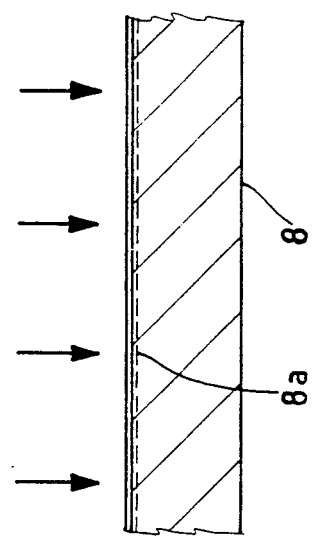
Figure 4C:
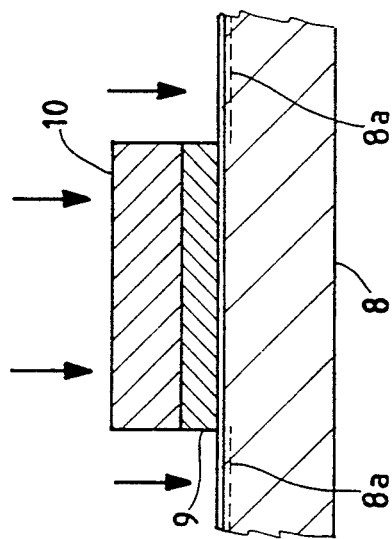
Figure 4A:
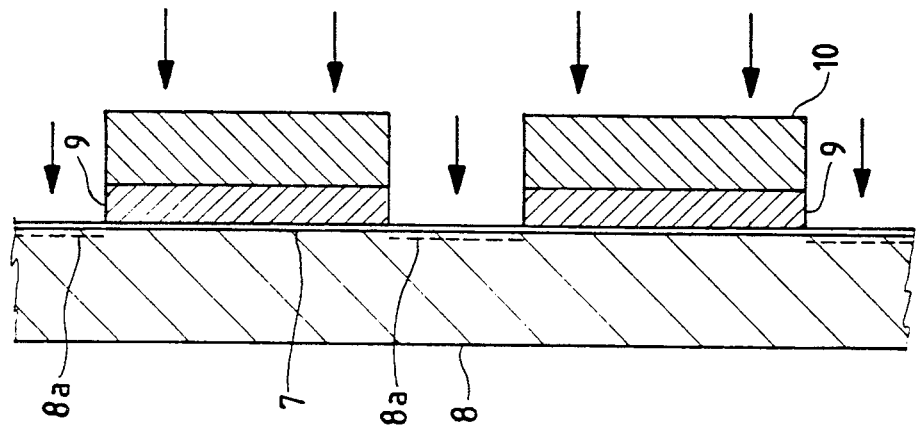
Figure 4:
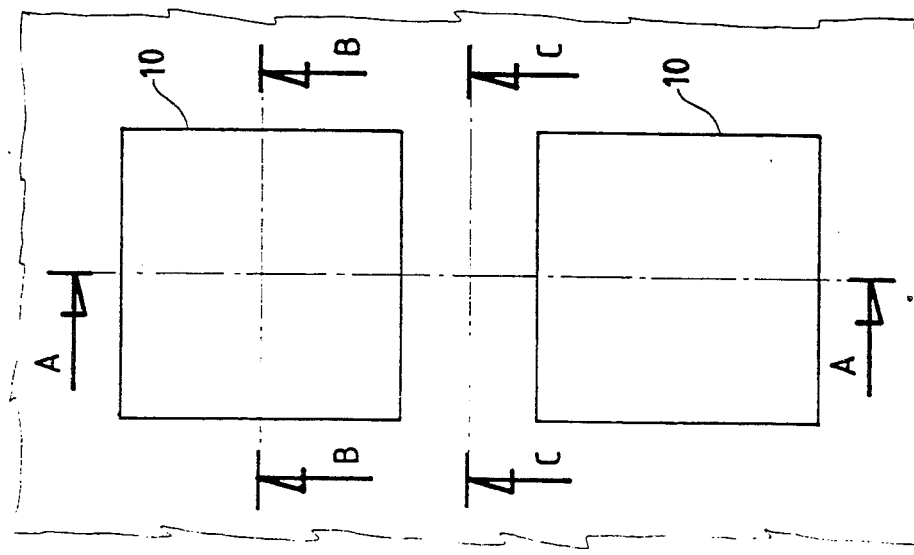

the series of figures from FIGS. 3, 3A and 3B to FIGS. 8, 8A, 8B and 8C, depicts, through schematic plan views and respectively orthogonal elevation cross sectional views, the fabrication process object of the present invention.

DESCRIPTION OF THE PREFERRED EMBODIMENT

In the following description of a preferred embodiment of the invention, the types of materials used as well as the ranges of variation of the thickness of the layers formed suitable for a certain application are expressly indicated. It is intended that dielectric and conducting materials different from the materials indicated in relation with this preferred embodiment though functionally equivalent thereto may also be used, as well as the respective thicknesses of the various layers may be modified in function of the type of material employed and of the type of integrated devices which must be fabricated.

The process of the invention for fabricating integrated MOSFET devices essentially comprises the following steps.

1. Gate oxidation of the surface of a monocrystalline silicon substrate 8 in accordance with a normal technique for forming a dielectric layer 7 having a thickness of about 200 Angstroms on the surface of the monocrystalline semiconducting silicon substrate 8.
2. Chemical vapor deposition of a layer of polycrystalline silicon 9 for a thickness of about 6.000 Angstroms.
3. Formation of a masking photoresist structure 10 over active areas.

These steps are depicted in the set of FIGS. 3, 3A, 3B and 3C, wherein FIG. 3 is a schematic plan view while the other figures are respectively orthogonal cross sectional views, the respective cross section planes of which are indicated in the plan view of FIG. 3.

4. Selective plasma etching of the polycrystalline silicon in unmasked areas until removing it completely therefrom. Optionally the etching may be arrested after having exposed the underlying silicon crystal for removing also the intermediate thin layer of gate oxide 7 in the etched areas, i.e. in the field isolation areas.

5. Ion implantation of a dopant for increasing the doping level of the semiconducting silicon substrate 8 in the isolation regions 8a.

These steps are depicted in the set of FIGS. 4, 4A, 4B and 4C, according to a similar illustration scheme of the preceding set of figures.

6. Removal of the residual masking photoresist structure 10 by means of a "barrel" etch or similar treatment, optionally followed by re-oxidation of the silicon in case the original gate oxide layer 7 had been removed at the end of the etching step of the polycrystalline silicon layer 9 performed during the preceding step 4.

7. Chemical vapor deposition, preferably conducted at low pressure and employing tetra-ethyl-orthosilicate (TEOS), of a conformal layer 11 of dielectric silicon oxide having a thickness substantially equal to the thickness of the matrix layer of polycrystalline silicon 9, which still covers the active areas (e.g. about 6.000 Angstroms).

8. Deposition of a layer of a planarization material 12, for example a layer of SOG (Spun-On-Glass) for filling the cavities of the surface of the conformally deposited dielectric layer 11.

These steps are depicted in the set of FIGS. 5, 5A, 5B and 5C, according to the same scheme of illustration of the preceding sets.

9. Planarization of the conformally deposited dielectric layer of silicon oxide 11 by a plasma etch-back treatment, continued until exposing the peaks of the portions of the polycrystalline silicon matrix layer 9 which still cover the active areas. The planarizing etch-back must be continued for a time sufficient to ensure a complete exposure of the surface of the portions of polycrystalline silicon 9 on the active areas and this "overetch" may indeed cause a slight lowering of the level of the silicon oxide layer 11 of the isolation structure, as schematically shown in the relative figures.

These steps are depicted in the set of FIGS. 6, 6A, 6B and 6C, according to the usual illustration scheme.

10. Chemical vapor deposition of a second layer of polycrystalline silicon 13 until obtaining a thickness of this second layer 13 of about 1.500-2.000 Angstroms.

11. Heavy doping of the polycrystalline silicon for increasing its electrical conductivity to a desired level.

These steps are depicted in the set of FIGS. 7, 7A, 7B and 7C, according to the usual illustration scheme.

12. Formation of a masking photoresist structure 14 for geometrically defining the gate structures of the integrated devices.

13. Selective etching of polycrystalline silicon until completely removing it from areas unmasked by the photoresist structure 14.

These last steps are depicted in the set of FIGS. 8, 8A, 8B and 8C according to the usual illustration scheme.

At this point, having thus completed the formation of the field isolation structure, constituted by the deposited dielectric layer of oxide (TEOS) 11 and by the underlying heavily doped region 8a of the semiconducting substrate 8, and the gate structures, patterned out of the matrix layer of polycrystalline silicon 9 which was originally utilized for masking the active areas during the deposition of the dielectric layer 11 and of the polycrystalline silicon layer 13 which was subsequently deposited over the portions of the matrix layer 9 in electrical continuity therewith, the fabrication process of the integrated devices may continue through a standard sequence of steps until conclusion, as it will be evident to a skilled technician.

Notwithstanding the fact that a preferred embodiment of the invention relative to a fabrication process characterized by a single level of polycrystalline silicon has been described, it will be obvious that the process of the invention may also be used in other fabrication processes utilizing also a second level of polycrystalline silicon for fabricating floating-gate-type devices such as for example EPROM, EEPROM, DRAM, and the like.

What I claim is:

1. A process for forming a field isolation structure of integrated devices, consituted by a dielectric layer formed over a region of a semiconducting substrate having an increased superficial doping level, for isolating active areas geometrically defined on the surface of said semiconducting substrate by said field isolation structure, and gate structures functionally disposed in respective active areas and constituted by an electrically connectable layer of conducting material electrically isolated from said semiconducting substrate by a dielectric gate layer, characterized by comprising the following steps:

a) forming a dielectric gate layer on the surface of a monocrystalline semiconducting substrate;
b) depositing a first layer of a first conducting material;
c) masking the active areas by a first masking photoresist structure;
d) etching at least said first layer of said first conducting material in unmasked areas, leaving portions of said first conducting layer in said masked active areas;
e) optionally implanting a dopant for increasing the superficial doping level of said semiconducting substrate in said etched areas;
f) removing said first masking photoresist structure;
g) conformally depositing a layer of a field isolation dielectric material for a thickness substantially equal to the thickness of said portions of said first conducting layer masking said active areas;
h) depositing a layer of a planarization material;
i) etching-back said planarization material until exposing the peaks of the said masking portions of said first conducting layer;
j) depositing a second layer of said first conducting material in electrical continuity with said portions of said first layer of conducting material;
k) forming a second masking photoresist structure for patterning the gate structures of the integrated devices;
l) selectively etching said first conducting material belonging to said second and to said first layers and removing it completely from unmasked areas.

2. The process according to claim 1, wherein said semiconducting substrate is monocrystalline silicon doped with a dopant of a first polarity; said field isolation dielectric material conformally deposited is silicon oxide chemically deposited from vapor phase at low pressure by employing as a precursor compound tetra-ethyl-ortho-silicate.

3. The process according to claim 1, wherein said first conducting material is doped polycrystalline silicon.

4. The process of claim 1 which further comprises implanting a dopant for increasing the superficial doping level of said semiconducting substrate in said etched area.

* * * * *